(12) United States Patent
Wang et al.

(10) Patent No.: US 12,557,711 B2
(45) Date of Patent: Feb. 17, 2026

(54) ELECTRONIC PACKAGE STRUCTURE AND MANUFACTURING METHOD THEREOF

(71) Applicant: Unimicron Technology Corp., Taoyuan (TW)

(72) Inventors: Chin-Sheng Wang, Taoyuan (TW); Ra-Min Tain, Hsinchu County (TW); Wen-Yu Lin, Taichung (TW); Tse-Wei Wang, Hsinchu (TW); Jun-Ho Chen, Taoyuan (TW); Guang-Hwa Ma, Hsinchu (TW)

(73) Assignee: Unimicron Technology Corp., Taoyuan (TW)

( * ) Notice: Subject to any disclaimer, the term of this patent is extended or adjusted under 35 U.S.C. 154(b) by 713 days.

(21) Appl. No.: 17/890,279

(22) Filed: Aug. 18, 2022

(65) Prior Publication Data

US 2023/0268256 A1 Aug. 24, 2023

Related U.S. Application Data

(60) Provisional application No. 63/311,449, filed on Feb. 18, 2022.

(30) Foreign Application Priority Data

Jul. 21, 2022 (TW) .................................. 111127319

(51) Int. Cl.
*H01L 23/498* (2006.01)
*H01L 21/48* (2006.01)
(Continued)

(52) U.S. Cl.
CPC .... *H01L 23/49811* (2013.01); *H01L 21/4853* (2013.01); *H01L 21/4857* (2013.01);
(Continued)

(58) Field of Classification Search
None
See application file for complete search history.

(56) References Cited

U.S. PATENT DOCUMENTS 6,952,049 B1 * 10/2005 Ogawa .................. H01L 23/642
257/700
7,709,942 B2 * 5/2010 Jobetto ................... H01L 24/29
257/E23.125
(Continued)

FOREIGN PATENT DOCUMENTS

CN 100435604 11/2008
TW 200950043 12/2009
(Continued)

OTHER PUBLICATIONS

"Office Action of Taiwan Counterpart Application", issued on Oct. 12, 2023, p. 1-p. 6.
(Continued)

*Primary Examiner* — Long Pham
(74) *Attorney, Agent, or Firm* — JCIPRNET

(57) ABSTRACT

An electronic package structure and manufacturing method thereof. The electronic package structure includes a circuit board, an interposer, a chip, a circuit structure, and a coaxial conductive element. The interposer is disposed on the circuit board. The interposer has a through groove. The chip is disposed in the through groove and located on the circuit board to electrically connect with the circuit board. The circuit structure is disposed on the interposer. The coaxial conductive element penetrates the interposer to electrically connect the circuit structure and the circuit board. The coaxial conductive element includes a first conductive structure, a second conductive structure, and a first insulating structure. The second conductive structure surrounds the first conductive structure. The first insulating structure is
(Continued)

disposed between the first conductive structure and the second conductive structure.

19 Claims, 23 Drawing Sheets

(51) Int. Cl.
*H01L 23/13* (2006.01)
*H01L 23/552* (2006.01)
*H01L 23/66* (2006.01)
*H05K 1/11* (2006.01)
*H05K 1/14* (2006.01)
*H01L 23/00* (2006.01)

(52) U.S. Cl.
CPC ............ *H01L 21/486* (2013.01); *H01L 23/13* (2013.01); *H01L 23/49822* (2013.01); *H01L 23/49833* (2013.01); *H01L 23/49838* (2013.01); *H01L 23/552* (2013.01); *H01L 23/66* (2013.01); *H05K 1/113* (2013.01); *H05K 1/144* (2013.01); *H05K 1/145* (2013.01); *H01L 24/16* (2013.01); *H01L 2223/6622* (2013.01); *H01L 2223/6677* (2013.01); *H01L 2224/16227* (2013.01); *H01L 2924/3025* (2013.01); *H05K 2201/10378* (2013.01)

(56) References Cited

U.S. PATENT DOCUMENTS

| | | | |
|---|---|---|---|
| RE45,146 E | | 9/2014 | Miyazaki et al. |
| 10,021,791 B2* | | 7/2018 | Sugiyama ............. H01L 23/142 |
| 11,289,456 B2* | | 3/2022 | Lee ......................... H01L 24/17 |
| 12,107,082 B2* | | 10/2024 | Mortensen ........ H01L 23/49816 |
| 2022/0254722 A1* | | 8/2022 | Yu ........................... H01L 24/19 |
| 2023/0369263 A1* | | 11/2023 | Chuang ................... H01L 25/04 |

FOREIGN PATENT DOCUMENTS

| | | |
|---|---|---|
| TW | 201631701 | 9/2016 |
| TW | 202135262 | 9/2021 |
| TW | 202207399 | 2/2022 |

OTHER PUBLICATIONS

"Office Action of Taiwan Related Application, Application No. 112114187", issued on Jan. 11, 2024, p. 1-p. 5.

* cited by examiner

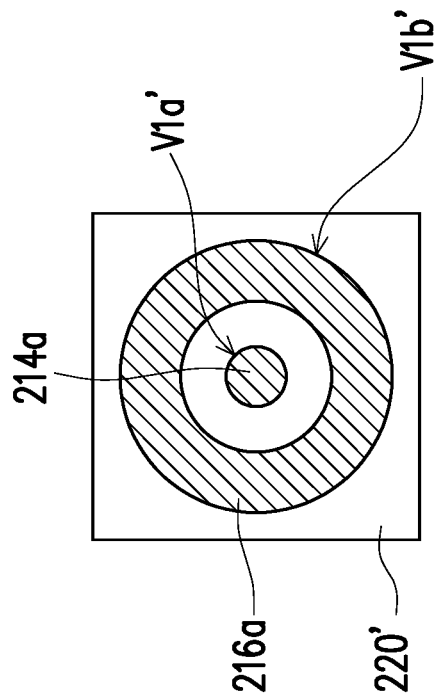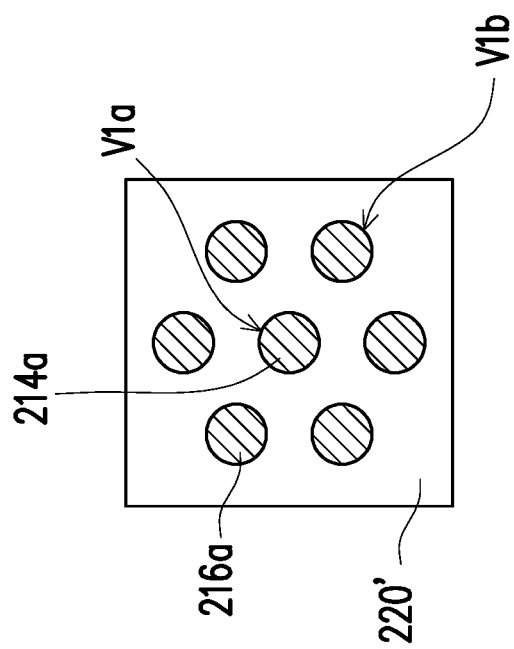
FIG. 4A
FIG. 4B

ELECTRONIC PACKAGE STRUCTURE AND MANUFACTURING METHOD THEREOF

CROSS-REFERENCE TO RELATED APPLICATION

This application claims the priority benefit of U.S. provisional application Ser. No. 63/311,449, filed on Feb. 18, 2022, and Taiwan application serial no. 111127319, filed on Jul. 21, 2022. The entirety of each of the above-mentioned patent applications is hereby incorporated by reference herein.

BACKGROUND

Technical Field

The disclosure relates to a package structure and a manufacturing method thereof, and in particular relates to an electronic package structure and a manufacturing method thereof.

Description of Related Art

With the advancement of technology, the functions of electronic products are becoming more and more abundant, and we are also increasingly dependent on electronic mobile devices. In response to the demands of miniaturization and weight reduction of electronic products, the integration of the antenna structure and the chip package structure contributes to the miniaturization and weight reduction of electronic products. Generally speaking, for the current chip package structure with antenna structure, the chip is usually disposed on the circuit board, and the chip is covered by a film sealing material to form the chip package structure. The antenna structure is disposed on the chip package structure, and the antenna structure is electrically connected to the circuit board through the conductive columns or conductive balls penetrating the film sealing material in the chip package structure. However, the above-mentioned package structure may not effectively prevent the radio frequency signal from spreading during the transmission process, and has a large volume.

SUMMARY

The disclosure provides an electronic package structure and a manufacturing method thereof, which may reduce signal loss and contribute to the miniaturization of the electronic package structure.

The electronic package structure of the disclosure includes a circuit board, an interposer, a chip, a circuit structure, and a coaxial conductive element. The interposer is disposed on the circuit board, in which the interposer has a through groove. The chip is disposed in the through groove and is located on the circuit board to electrically connect with the circuit board. The circuit structure is disposed on the interposer. The coaxial conductive element penetrates the interposer to electrically connect the circuit structure and the circuit board. The coaxial conductive element includes a first conductive structure, a second conductive structure, and a first insulating structure. The second conductive structure surrounds the first conductive structure. The first insulating structure is disposed between the first conductive structure and the second conductive structure.

In an embodiment of the disclosure, the interposer includes a first insulating layer and a first conductive layer. The first insulating layer has an upper surface and a lower surface opposite to the upper surface. The first conductive layer is disposed on the upper surface and the lower surface of the first insulating layer, in which the through groove penetrates the first insulating layer and the first conductive layer.

In an embodiment of the disclosure, the coaxial conductive element is disposed around the through groove.

In an embodiment of the disclosure, the circuit structure includes a first core layer, a first antenna layer, a second antenna layer, and multiple pads. The first core layer has a first surface and a second surface opposite to the first surface, in which the second surface faces the interposer. The first antenna layer is disposed on the first surface. The second antenna layer is disposed on the second surface. The pads are disposed on the second surface and correspond to the coaxial conductive element.

In an embodiment of the disclosure, the pads include a first pad and a second pad. The first pad corresponds to the first conductive structure of the coaxial conductive element. The second pad corresponds to the second conductive structure of the coaxial conductive element, in which the second pad is annular.

In an embodiment of the disclosure, the pads include a first pad and multiple second pads. The first pad corresponds to the first conductive structure of the coaxial conductive element. The second pads correspond to the second conductive structure of the coaxial conductive element, in which the second pads surround the first pad.

In an embodiment of the disclosure, the electronic package structure further includes a first conductive connection element disposed between the pads of the circuit structure and the coaxial conductive element.

In an embodiment of the disclosure, the electronic package structure further includes a first adhesive layer disposed between the interposer and the circuit structure.

In an embodiment of the disclosure, the circuit board includes multiple pads corresponding to the coaxial conductive element, and the electronic package structure further includes a second conductive connection element disposed between the pads of the circuit board and the coaxial conductive element.

In an embodiment of the disclosure, the first conductive structure of the coaxial conductive element is suitable for transmitting a signal, and the second conductive structure is suitable for grounding or connecting to a power source.

The manufacturing method of the electronic package structure of the disclosure includes the following process. A circuit board is provided. A chip is disposed on the circuit board. An interposer substrate is provided. A coaxial conductive element is formed in the interposer substrate, in which the coaxial conductive element includes a first conductive structure, a second conductive structure, and a first insulating structure. The second conductive structure surrounds the first conductive structure. The first insulating structure is disposed between the first conductive structure and the second conductive structure. A through groove is formed in the interposer substrate to form an interposer. A circuit structure is provided, and the circuit structure is pressed on the interposer at a first temperature. After the circuit structure is pressed on the interposer, the interposer is bonded to the circuit board at a second temperature, and the chip is disposed in the through groove of the interposer.

In an embodiment of the disclosure, the interposer substrate includes a first insulating layer and a first conductive material layer covering an upper surface and a lower surface of the first insulating layer, and the upper surface and the lower surface are opposite to each other. Forming the coaxial conductive element in the interposer substrate includes the following process. A first through hole is formed in the interposer substrate. A second conductive material layer is formed on a surface of the interposer substrate and a sidewall of the first through hole. The first through hole is filled by an insulating material. A second through hole is formed in the insulating material. A third conductive material layer is formed on the interposer substrate and in the second through hole. The third conductive material layer is patterned to form the coaxial conductive element.

In an embodiment of the disclosure, a hole diameter of the first through hole is between 250 μm to 450 μm, and a hole diameter of the second through hole is between 50 μm to 100 μm.

In an embodiment of the disclosure, the manufacturing method further includes the following process. A first adhesive material layer is formed on the upper surface of the first insulating layer, in which the first adhesive material layer is in a semi-cured state. After the first adhesive material layer is formed on the upper surface of the first insulating layer, a through groove is formed in the interposer substrate to form the interposer. Multiple vias are formed in the first adhesive material layer to expose a portion of the coaxial conductive element. A first conductive connection material is formed in the vias.

In an embodiment of the disclosure, the first conductive connection material includes copper glue, silver glue, or transient liquid phase sintering glue.

In an embodiment of the disclosure, pressing the circuit structure on the interposer includes the following process. Multiple pads of the circuit structure are correspondingly connected to the first conductive connection material. A side of the interposer opposite to the first conductive connection material is covered by a release layer, so that the through groove is filled by the release layer. At the first temperature, the circuit structure and the interposer are pressed together to cure the first adhesive material layer. Then, the release layer is removed.

In an embodiment of the disclosure, bonding the interposer to the circuit board includes the following process. A solder resist layer is formed on the lower surface of the first insulating layer. The solder resist layer includes multiple vias to expose a portion of the coaxial conductive element. A second conductive connection material is formed in the vias. The interposer and the circuit board are bonded through the second conductive connection material.

In an embodiment of the disclosure, the second conductive connection material includes a solder paste or a solder ball.

In an embodiment of the disclosure, the second conductive connection material is subjected to a reflow process at the second temperature to form a second conductive connection element. The second temperature is greater than the first temperature.

In an embodiment of the disclosure, the first temperature is between 180° C. to 220° C., and the second temperature is between 250° C. to 270° C.

Based on the above, the electronic package structure of the disclosure may integrate the circuit board, the interposer, and the circuit structure into a package structure, and the chip is disposed in the through groove of the interposer, so that the space may be effectively utilized, which is beneficial to the miniaturization of the electronic package structure. In addition, the electronic package structure also includes a coaxial conductive element disposed in the interposer, which may effectively prevent the signal loss caused by the spread of the radio frequency signal during the transmission process, and may shield the electromagnetic interference signal to improve the integrity of the signal.

BRIEF DESCRIPTION OF THE DRAWING

FIG. 4A to FIG. 4B are partial top schematic views of a region R1 of FIG. 3A.

DETAILED DESCRIPTION OF DISCLOSED EMBODIMENTS

Figure 1A:
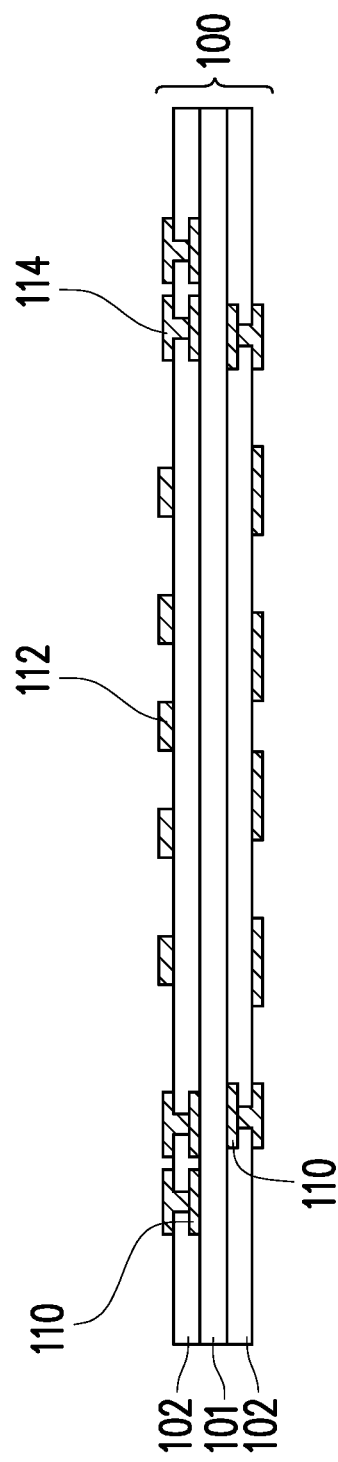
FIG. 1A to FIG. 1C are cross-sectional schematic views of a manufacturing process for bonding a circuit board and a chip according to an embodiment of the disclosure.

The following examples are described in detail with the accompanying drawings, but the provided examples are not intended to limit the scope of the disclosure. In addition, the drawings are for illustrative purposes only and are not drawn in full scale. In order to facilitate understanding, the same elements in the following description are described with the same symbols.

In addition, the terms such as "including", "comprising", "having", etc. used in the text are all open-ended terms, that is, "including but not limited to".

It should be understood that, although the terms "first", "second", "third", or the like may be used herein to describe various elements, components, regions, layers, and/or portions, these elements, components, regions, and/or portions should not be limited by these terms. These terms are only used to distinguish one element, component, region, layer, or portion from another element, component, region, layer, or portion. Thus, "a first element," "component," "region," "layer," or "portion" discussed below may be referred to as a second element, component, region, layer, or portion without departing from the teachings herein.

In the disclosure, wordings used to indicate directions, such as "up," "down," "front," "back," "left," and "right," merely refer to directions in the accompanying drawings. Therefore, the directional terms are used to illustrate rather than limit the disclosure.

In the accompanying drawings, the drawings illustrate the general features of the methods, structures, and/or materials used in the particular embodiments. However, the drawings shall not be interpreted as defining or limiting the scope or nature covered by the embodiments. For example, the relative sizes, thicknesses, and locations of the layers, regions, and/or structures may be reduced or enlarged for clarity.

In the following embodiments, the same or similar elements will be designated by the same or similar reference numerals, and descriptions thereof will be omitted. In addition, the features of different embodiments may be combined with each other when they are not in conflict, and simple equivalent changes and modifications made according to the specification or the claims are still within the scope of the disclosure.

Figure 1B:
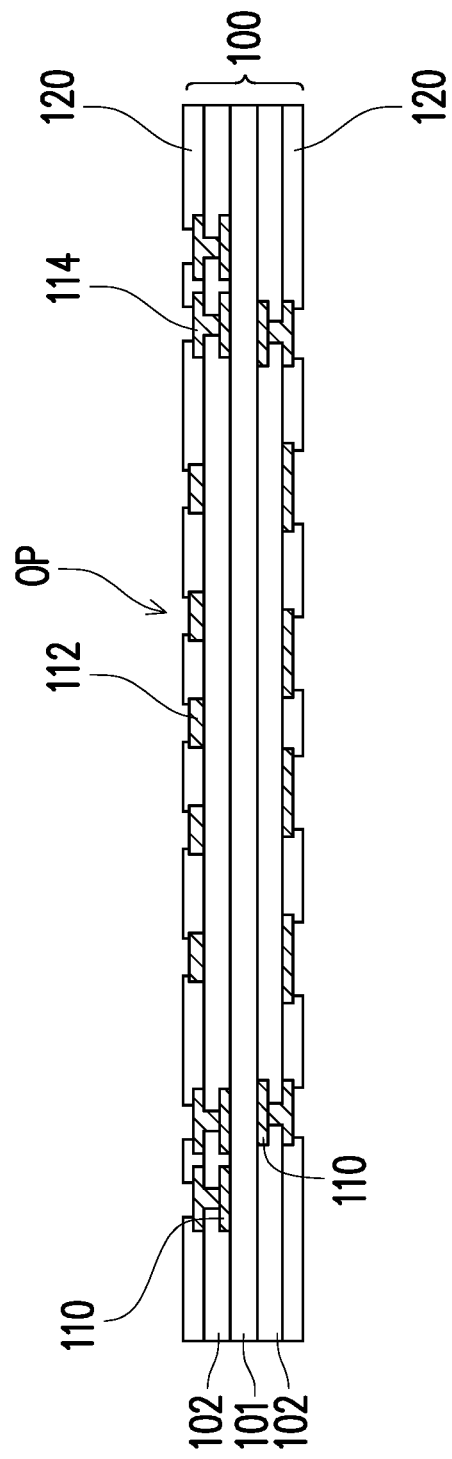
Figure 1C:
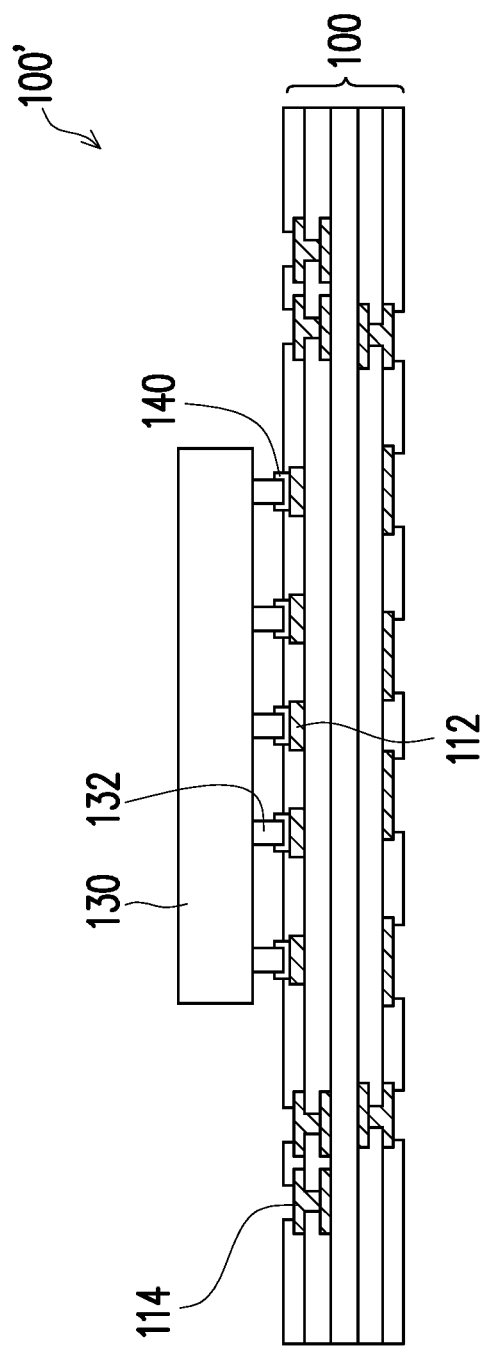

FIG. 1A to FIG. 1C are cross-sectional schematic views of a manufacturing process for bonding a circuit board and a chip according to an embodiment of the disclosure.

Referring to FIG. 1A, a circuit board 100 is provided. The circuit board 100 is, for example, a printed circuit board (PCB), a flexible printed circuit board (FPC), or other suitable circuit boards. For example, the circuit board 100 may include a core substrate 101, and insulating layers 102 and circuit layers 110 alternately stacked on both sides of the core substrate 101. The topmost layer of the circuit layer 110 may include multiple pads 112 and 114. The pad 112 may be used for subsequent connection with the chip contacts, and the pad 114 may be used for the corresponding connection with the coaxial conductive element.

It should be understood that FIG. 1A only schematically shows two insulating layers 102 and four circuit layers 110 on the core substrate 101, but is not intended to limit the disclosure. The number of insulating layers and circuit layers and the wiring design of the circuit layers may be adjusted according to actual needs. In addition, although the core substrate of the disclosure does not show any vias, it is not intended to limit the disclosure, and vias may be disposed in the core substrate according to actual needs.

Referring to FIG. 1B, solder resist layers 120 are formed on both sides of the circuit board 100. The solder resist layer 120 has multiple openings OP to expose the outermost portion of the circuit layer 110 of the circuit board 100. For example, the pads 112 and 114 are exposed by the opening OP to facilitate subsequent connection with other components. The material of the solder resist layer 120 may be a solder resist material (e.g., green paint), a photosensitive dielectric material, or other suitable materials.

Referring to FIG. 1C, a chip 130 is disposed on the circuit board 100. For example, the active surface of the chip 130 may include multiple contacts 132, and the contacts 132 correspond to the pads 112 of the circuit board 100, so that the chip 130 is disposed on the circuit board 100 and electrically connected.

In some embodiments, before the contacts 132 of the chip 130 are correspondingly connected to the pads 112 of the circuit board 100, an underfill 140 may be disposed in the openings OP exposing the pads 112, and subsequent bonding is performed to improve the bonding strength of the chip 130 and the circuit board 100. The material of the underfill 140 is, for example, an epoxy solder paste or other suitable materials. In other embodiments, the material of the underfill 140 may also be epoxy flux, epoxy glue, or other suitable materials, and the underfill 140 may be disposed between the chip 130 and the circuit board 100 after the contacts 132 of the chip 130 are correspondingly connected to the pads 112 of the circuit board 100. In still other embodiments, the underfill 140 may not be disposed, and the contacts 132 of the chip 130 and the contact pads 112 of the circuit board 100 may be directly bonded correspondingly.

In some embodiments, the underfill 140 may be disposed in the space between the chip 130 and the circuit board 100 to laterally cover a portion of the sidewalls of the contacts 132, or completely cover the sidewalls of the contacts 132.

After the above-mentioned process, the fabrication of a circuit board structure 100' of the circuit board 100 including the chip 130 may be substantially completed.

FIG. 2A to FIG. 2H are cross-sectional schematic views of a manufacturing process of an interposer according to an embodiment of the disclosure.

Figure 2A:
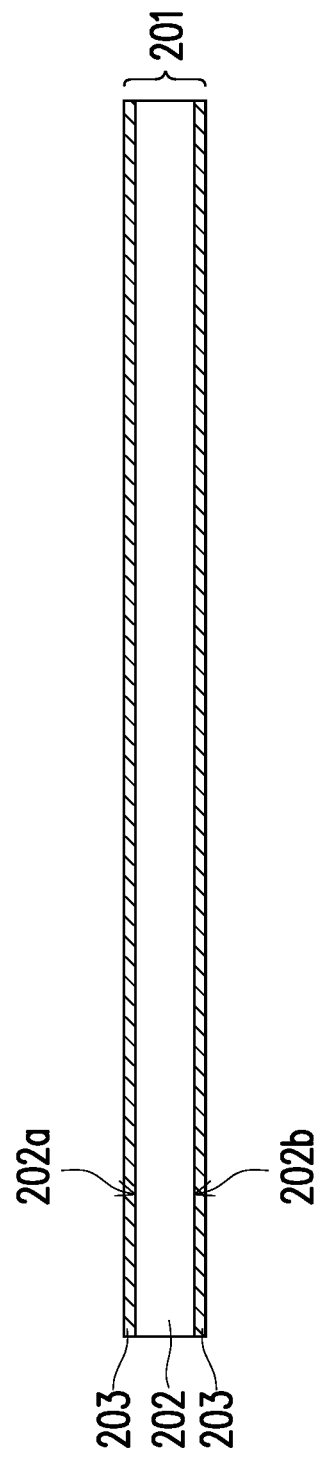
FIG. 2A to FIG. 2H are cross-sectional schematic views of a manufacturing process of an interposer according to an embodiment of the disclosure.

Referring to FIG. 2A, an interposer substrate 201 is provided. For example, the interposer substrate 201 includes a first insulating layer 202 and a first conductive material layer 203 covering an upper surface 202a and a lower surface 202b of the first insulating layer 202, and the upper surface 202a and the lower surface 202b are opposite to each other. The material of the first insulating layer 202 is, for example, glass fiber containing resin or other suitable insulating materials, and the thickness of the first insulating layer 202 may be between 150 μm to 250 μm. The first conductive material layer 203 may be a copper foil, which covers the upper surface 202a and the lower surface 202b of the first insulating layer 202 through a pressing process.

Figure 2B:
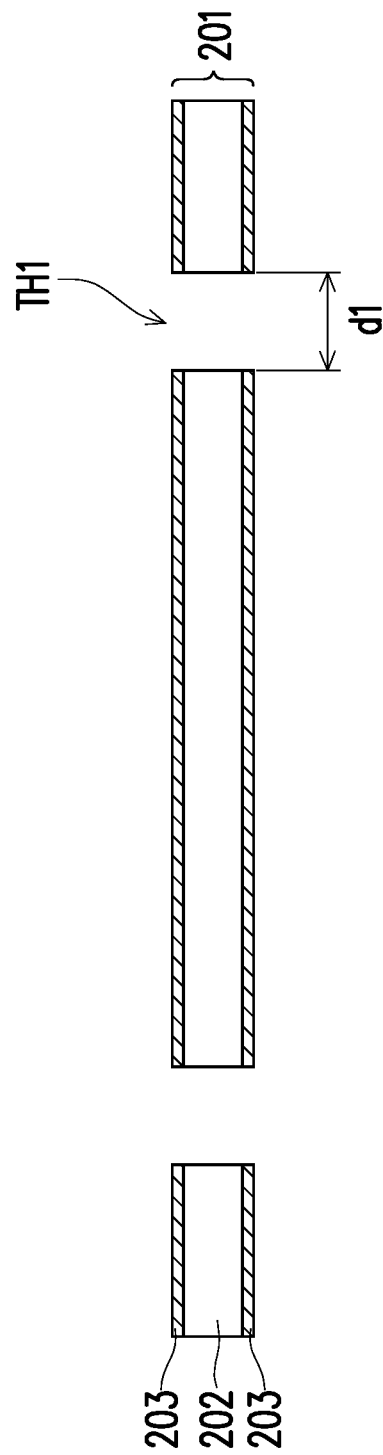

Referring to FIG. 2B, a first through hole TH1 is formed in the interposer substrate 201. For example, the first through hole TH1 penetrating the interposer substrate 201 may be formed in the interposer substrate 201 by mechanical drilling or a laser. That is to say, the first through hole TH1 may penetrate the first insulating layer 202 and the first conductive material layer 203. The hole diameter d1 of the first through hole TH1 may be between 250 μm to 450 μm.

Figure 2C:
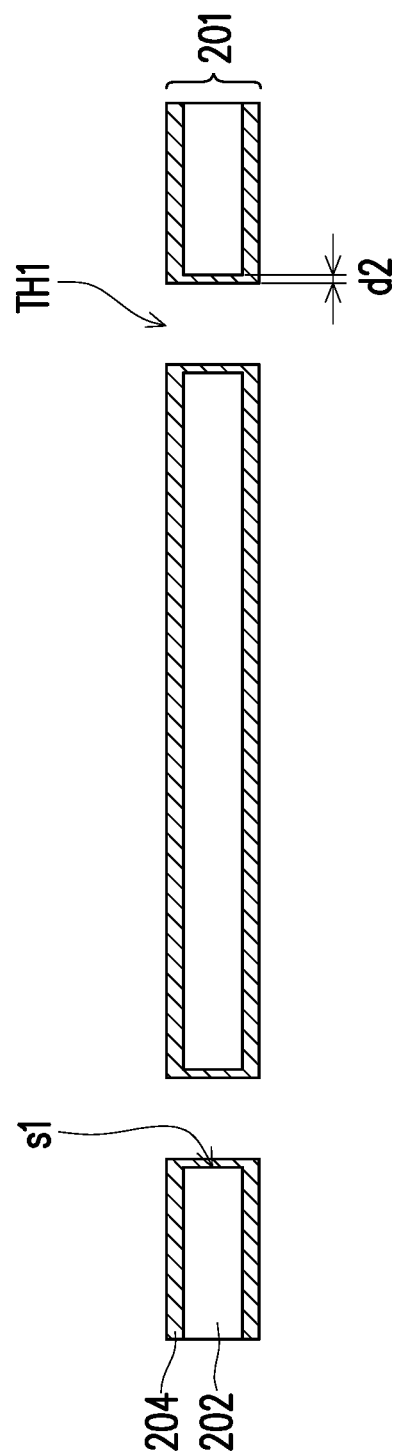

Referring to FIG. 2C, a second conductive material layer 204 is formed on the surface of the interposer substrate 201 and a sidewall s1 of the first through hole TH1. For example, a copper layer may be electroplated on the first conductive material layer 203 located on the upper surface 202a and the lower surface 202b of the first insulating layer 202 and on the sidewall s1 of the first through hole TH1 through an electroplating process to form the second conductive material layer 204. A thickness d2 of the second conductive material layer 204 on the sidewall s1 of the first through hole TH1 may be between about 10 μm to 15 μm.

Figure 2D:
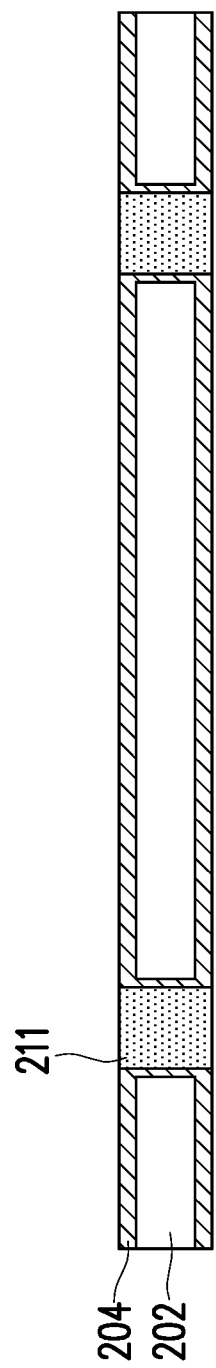

Referring to FIG. 2D, the first through hole TH1 is filled by an insulating material 211. The insulating material 211 may be, for example, epoxy resin, polyester resin, polyimide, or other suitable insulating materials.

Figure 2E:
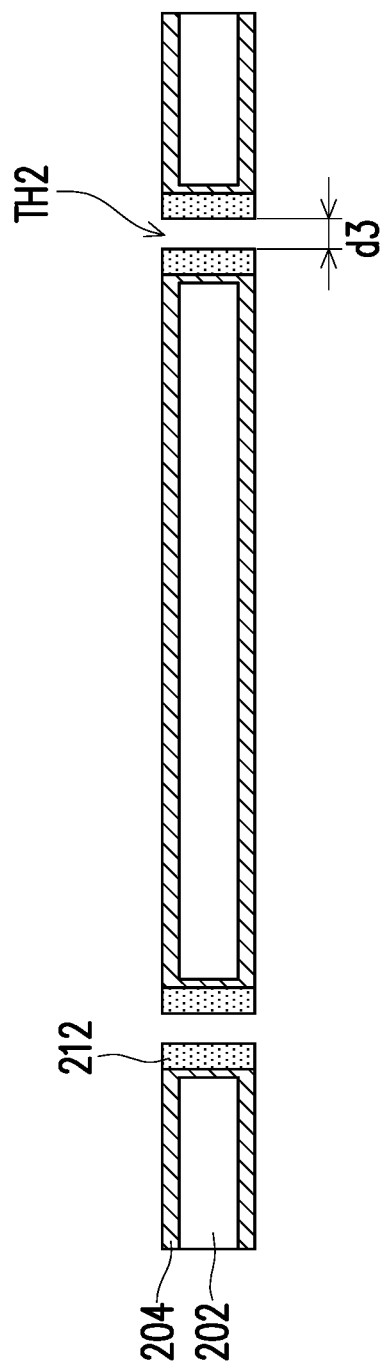

Referring to FIG. 2E, a second through hole TH2 is formed in the insulating material 211. For example, the second through hole TH2 may be formed at the center of the insulating material 211 by mechanical drilling or a laser. That is to say, the second through hole TH2 and the first through hole TH1 (marked in FIG. 2B) basically have the same axis. The hole diameter d3 of the second through hole TH2 may be between 50 μm to 100 μm. Due to the formation of the second through hole TH2, a portion of the insulating material 211 is removed to form a first insulating structure 212. The first insulating structure 212 is a hollow cylinder, that is, if viewed from a top view, the shape of the first insulating structure 212 is annular.

Figure 2F:
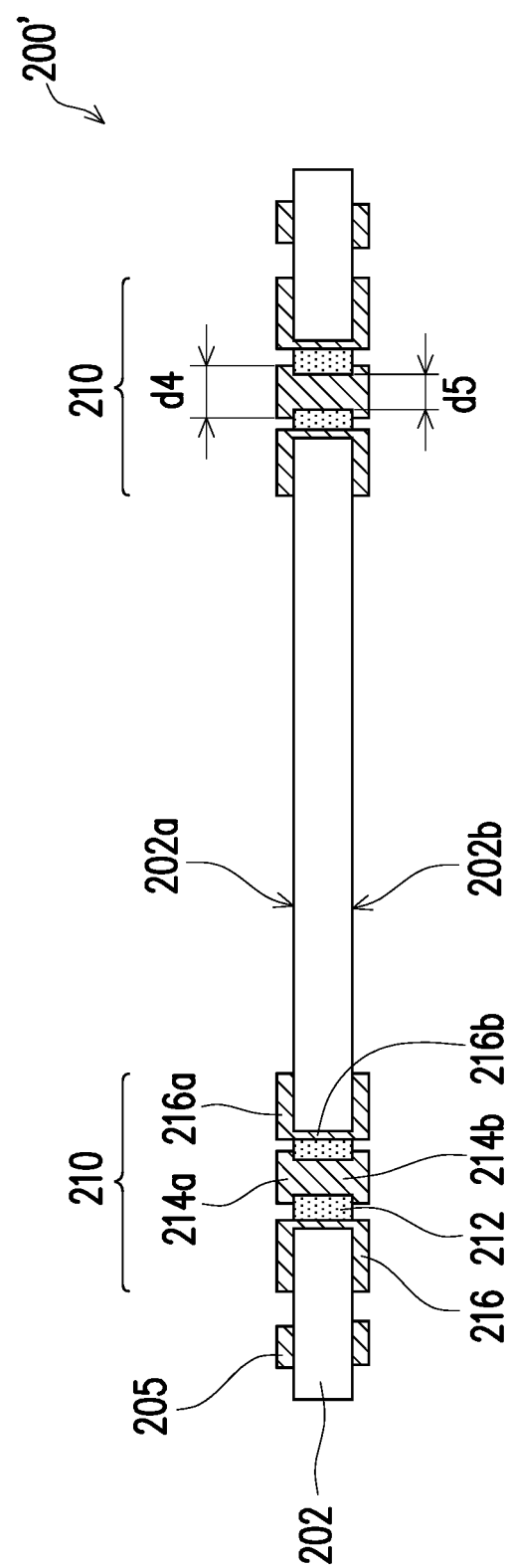

Referring to FIG. 2E and FIG. 2F, a third conductive material layer (not shown) is formed on the interposer substrate 201 and in the second through hole TH2 (marked in FIG. 2E). The third conductive material layer is patterned to form a coaxial conductive element 210 and a first conductive layer 205. For example, a copper layer may be electroplated on the second conductive material layer 204 located on the upper surface 202a and the lower surface 202b of the first insulating layer 202 and in the second through hole TH2 through an electroplating process to form the third conductive material layer. In some embodiments, the second through hole TH2 may be filled by the third conductive material layer.

Afterwards, the third conductive material layer may be patterned by etching to form the coaxial conductive element 210 and the first conductive layer 205. Specifically, the first conductive layer 205 is disposed on the upper surface 202a and the lower surface 202b of the first insulating layer 202.

The coaxial conductive element 210 may include a first conductive structure 214, a second conductive structure 216, and a first insulating structure 212. The first conductive structure 214 may include a first conductive column portion 214b and a first pad portion 214a located at both ends of the first conductive column portion 214b. The first conductive column portion 214b is located in the second through hole TH2 to electrically connect the first pad portions 214a at both ends thereof. The diameter of the first pad portion 214a may be larger than the diameter of the first conductive column portion 214b. For example, a diameter d4 of the first pad portion 214a may be between 75 μm to 175 μm, and a diameter d5 of the first conductive column portion 214b may be between 50 μm to 100 μm.

The second conductive structure 216 surrounds the first conductive structure 214. The second conductive structure 216 may include a second conductive column portion 216b and a second pad portion 216a located at both ends of the second conductive column portion 216b. The second pad portion 216a surrounds the first pad portion 214a with the first pad portion 214a as the center. The second conductive column portion 216b is located on the sidewall s1 (marked in FIG. 2C) of the first through hole TH1 (marked in FIG. 2C) to electrically connect the second pad portions 216a at both ends thereof.

The first insulating structure 212 is disposed between the first conductive structure 214 and the second conductive structure 216 and surrounds the first conductive column portion 214b of the first conductive structure 214, so that the first conductive structure 214 is electrically separated from the second conductive structure 216.

In some embodiments, a portion of the first conductive layer 205 may constitute the first pad portion 214a and the second pad portion 216a.

After the above process, the fabrication of an interposer substrate 200' including the coaxial conductive element 210 may be substantially completed.

Figure 2G:
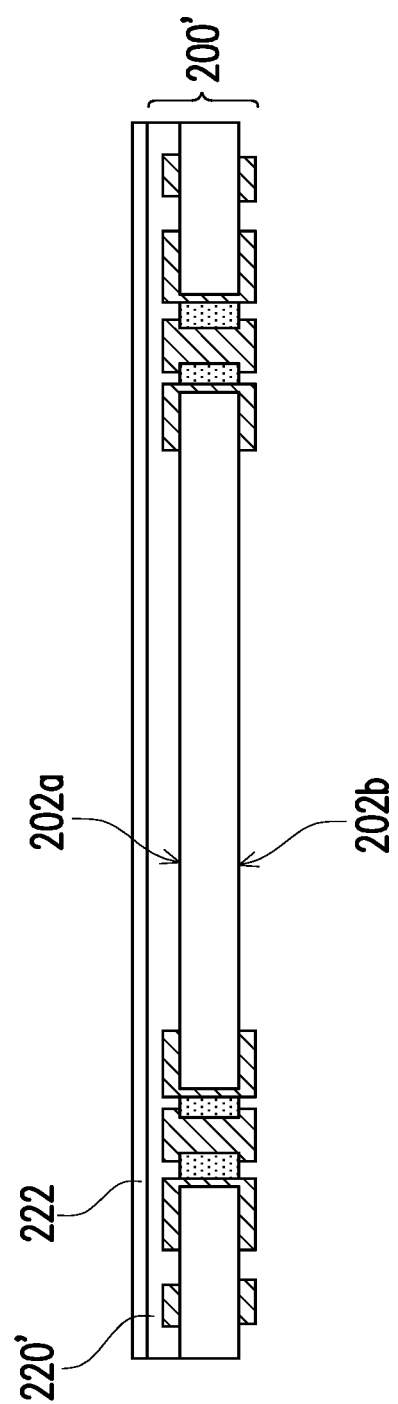

Then, referring to FIG. 2G, a first adhesive material layer 220' is formed on one side of the interposer substrate 200'. For example, the first adhesive material layer 220' may be formed on the upper surface 202a of the first insulating layer 202 of the interposer substrate 200' by laminating, so that the first adhesive material layer 220' covers the first pad portion 214a (marked in FIG. 2F), the second pad portion 216a (marked in FIG. 2F), and the first conductive layer 205 (marked in FIG. 2F). The first adhesive material layer 220' may be in a semi-cured state. For example, the first adhesive material layer 220' may include resin in a semi-cured state, such as a b-stage epoxy resin glue/tape, a b-stage epoxy fiberglass layer (prepreg, PP) or other suitable material. In some embodiments, the side of the first adhesive material layer 220' that is not in contact with the interposer substrate 200' may include a release film 222, that is, the first adhesive material layer 220' is located between the interposer substrate 200' and the release film 222, but the disclosure is not limited thereto.

Figure 2H:
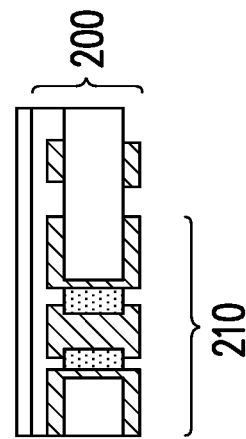
Figure 2H:
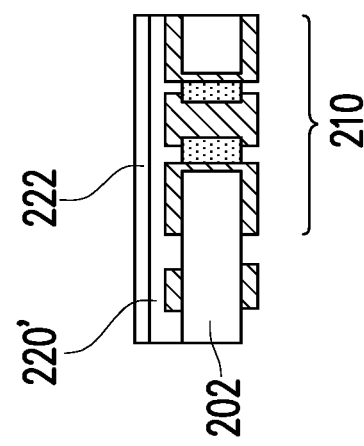

Referring to FIG. 2H, a through groove 230 is formed in the interposer substrate 200' to form the interposer 200. For example, the through groove 230 may be formed by punching or a laser. The through groove 230 may penetrate the first insulating layer 202, the first conductive layer 205, the first adhesive material layer 220', and the release film 222 (if any). In some embodiments, the through groove 230 is located between two adjacent coaxial conductive elements 210.

After the above-mentioned process, the fabrication of the interposer 200 including the coaxial conductive element 210 and having the through groove 230 may be substantially completed.

Figure 3A:
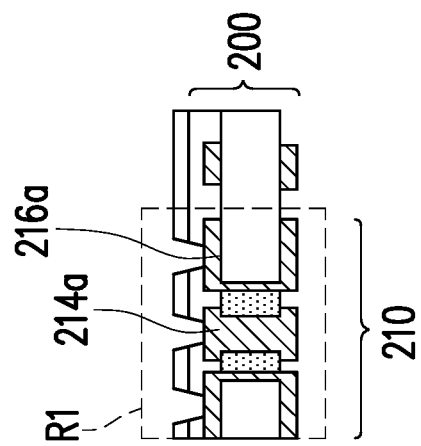
FIG. 3A to FIG. 3C are cross-sectional schematic views of a manufacturing process of a first conductive connection element according to an embodiment of the disclosure.
Figure 3A:
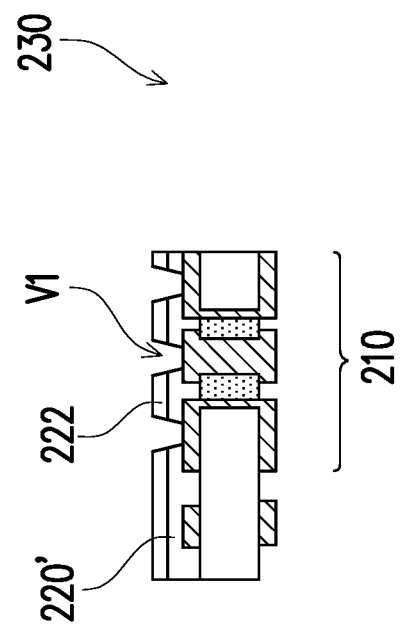
Figure 3B:
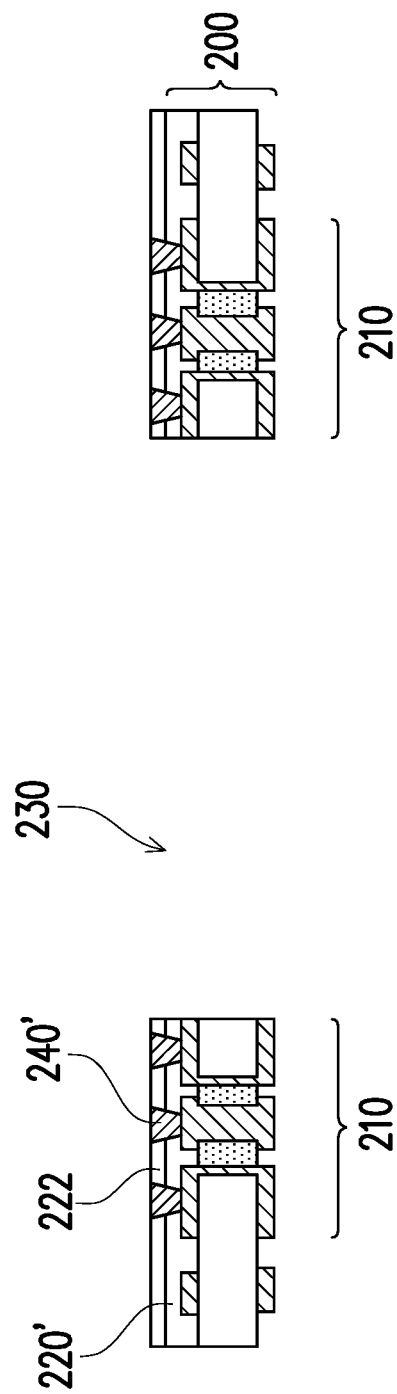
Figure 3C:
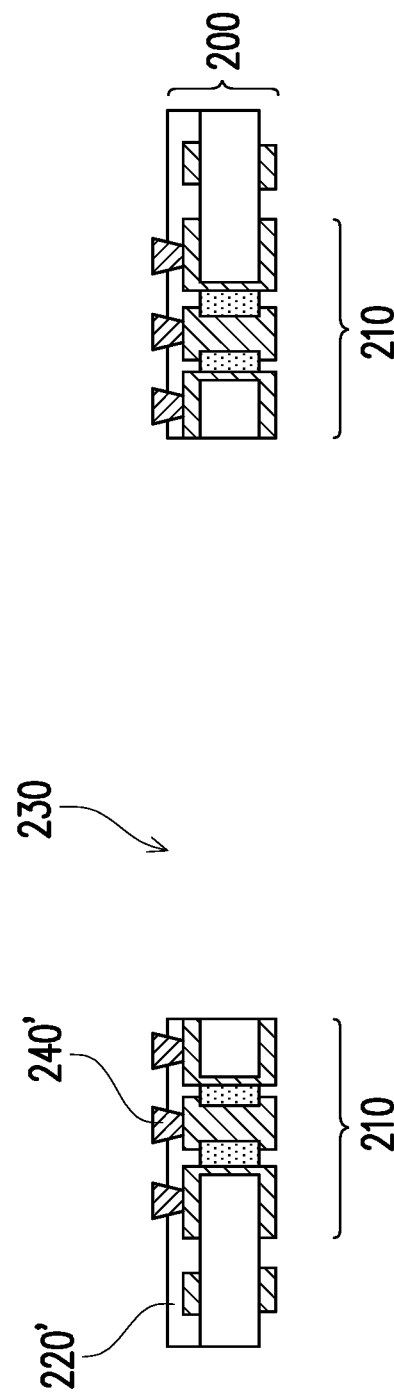

FIG. 3A to FIG. 3C are cross-sectional schematic views of a manufacturing process of a first conductive connection element according to an embodiment of the disclosure. FIG. 4A to FIG. 4B are partial top schematic views of a region R1 of FIG. 3A. FIG. 3A may be a continuation process of FIG. 2H.

Referring to FIG. 3A, multiple vias V1 are formed in the first adhesive material layer 220' and the release film 222 (if any) to expose a portion of the coaxial conductive element 210. For example, multiple vias V1 may be formed in the first adhesive material layer 220' and the release film 222 (if any) by laser drilling. The vias V1 may expose a portion of the first pad portion 214a and a portion of the second pad portion 216a of the coaxial conductive element 210.

In some embodiments, in a top view, as shown in FIG. 4A, the vias V1 may include a via V1a and multiple vias V1b surrounding the via V1a. The via V1a corresponds to the first pad portion 214a to expose a portion of the first pad portion 214a, and the vias V1b correspond to the second pad portion 216a to expose a portion of the second pad portion 216a. In this embodiment, only six vias V1b surrounding the via V1a are schematically shown, but are not intended to limit the disclosure, and the number of the vias V1b may be adjusted according to actual needs. For example, the shortest distance between adjacent vias V1b may be designed to be less than or equal to 1/10 of the wavelength of the radio wave to be transmitted.

In other embodiments, in a top view, as shown in FIG. 4B, the vias V1 may include a via V1a' and a single via V1b' surrounding the via V1a'. The via V1a' corresponds to the first pad portion 214a to expose a portion of the first pad portion 214a. The shape of the via V1b' may be disposed as annular corresponding to the second pad portion 216a to expose a portion of the second pad portion 216a.

Referring to FIG. 3B and FIG. 3C, a first conductive connection material 240' is formed in the vias V1, and then the release film 222 (if any) is removed. The first conductive connection material 240' may be, for example, silver glue, copper glue, transient liquid phase sintering (TLPS) conductive glue, or other suitable materials.

Figure 5A:
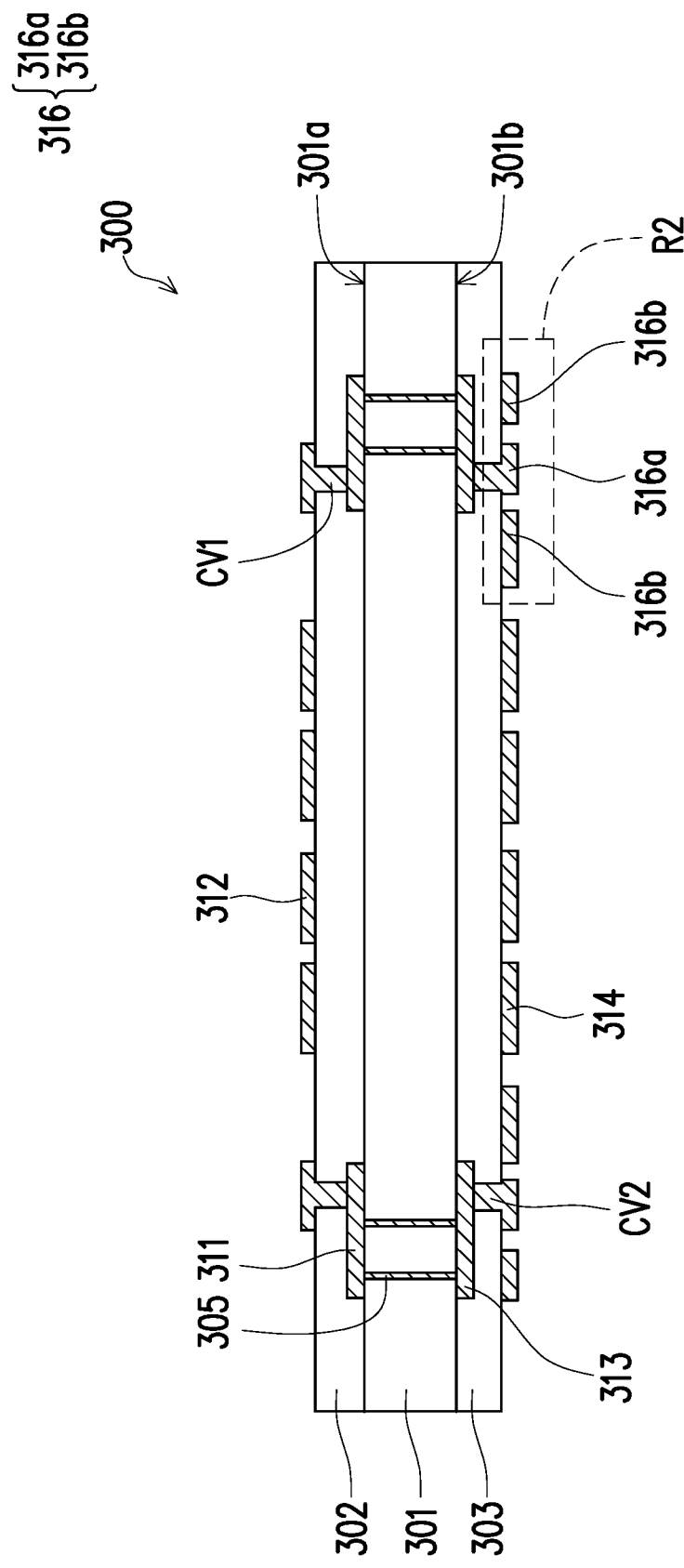
FIG. 5A to FIG. 5C are schematic views of a circuit structure according to an embodiment of the disclosure.
Figure 5C:
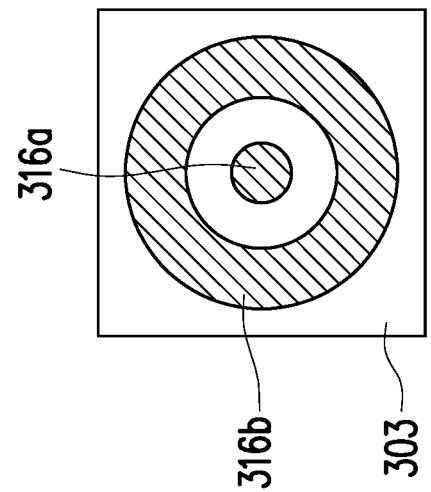
Figure 5B:
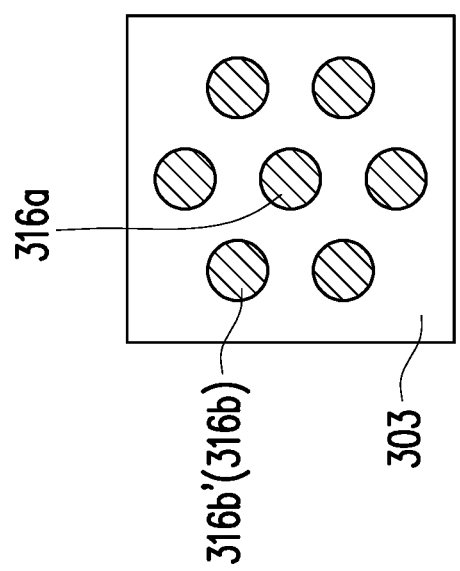

FIG. 5A to FIG. 5C are schematic views of a circuit structure according to an embodiment of the disclosure. FIG. 5A is a cross-sectional schematic view of a circuit structure according to an embodiment of the disclosure. FIG. 5B is a bottom schematic view of a region R2 of FIG. 5A. FIG. 5C is another bottom schematic view of the region R2 of FIG. 5A.

Referring to FIG. 5A to FIG. 5C, a circuit structure 300 includes a first core layer 301, a first antenna layer 312, a second antenna layer 314, and multiple pads 316. The first core layer 301 has a first surface 301a and a second surface 301b opposite to the first surface 301a. The first antenna layer 312 is disposed on the first surface 301a. The second antenna layer 314 and the pads 316 are disposed on the second surface 301b, that is, the second antenna layer 314 and the pads 316 are the same film layer. The pads 316 may correspond to the coaxial conductive elements 210 to facilitate subsequent connection with the coaxial conductive elements 210. For example, the plurality of pads 316 may include a first pad 316a and a second pad 316b. The first pad 316a corresponds to the first pad portion 214a of the coaxial conductive element 210, and the second pad 316b corresponds to the second pad portion 216a of the coaxial conductive element 210.

In some embodiments, as shown in FIG. 5B, the second pad 316b may be multiple second pads 316b'. The second pads 316b' correspond to the second conductive structure 216 of the coaxial conductive element 210. The second pads 316b' surround the first pad 316a. In other embodiments, as shown in FIG. 5C, the second pad 316b may be a single second pad 316b. The second pad 316b is annular and surrounds the first pad 316a, and may correspond to the second conductive structure 216 of the coaxial conductive element 210.

In some embodiments, the circuit structure 300 further includes conductive layers 311 and 313 and insulating layers 302 and 303. The conductive layers 311 and 313 are respectively disposed on the first surface 301a and the second surface 301b of the first core layer 301. The insulating layer 302 is disposed between the conductive layer 311 and the first antenna layer 312, and has a conductive via CV1 disposed in the insulating layer 302 to electrically connect the conductive layer 311 and the first antenna layer 312. The insulating layer 303 is disposed between the conductive layer 313 and the second antenna layer 314, and has a conductive via CV2 disposed in the insulating layer 303 to electrically connect the conductive layer 313 and the second antenna layer 314 or the pad 316.

In some embodiments, the circuit structure 300 further includes a conductive column 305 penetrating the first core layer 301 to electrically connect the conductive layer 311 and the conductive layer 313. The conductive column 305 may be, for example, a solid metal column or a hollow metal column with the hollow metal column filled by insulating materials, but the disclosure is not limited thereto. In other embodiments, the circuit structure 300 may not include conductive columns penetrating the first core layer 301.

It should be understood that FIG. 5A only schematically shows the insulating layer, the conductive layer and the antenna layer of the circuit structure 300, but is not intended to limit the disclosure. The number and wiring design of the insulating layer, the conductive layer, and the antenna layer may be adjusted according to actual needs.

FIG. 6A to FIG. 6E are cross-sectional schematic views of a manufacturing process of an electronic package structure according to an embodiment of the disclosure.

Figure 6A:
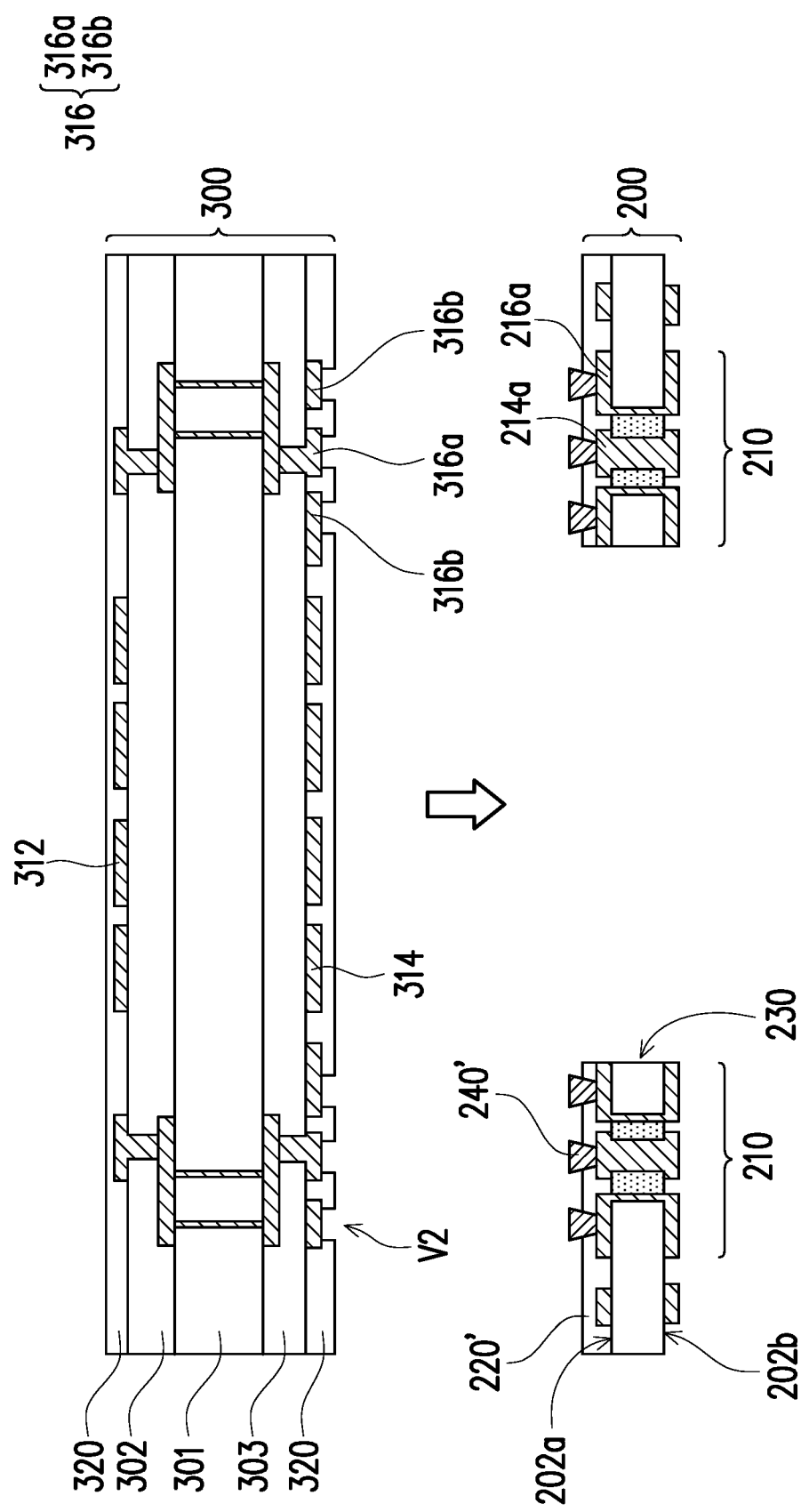
FIG. 6A to FIG. 6E are cross-sectional schematic views of a manufacturing process of an electronic package structure according to an embodiment of the disclosure.

Referring to FIG. 6A, a circuit structure 300 is provided. The circuit structure 300 is, for example, the circuit structure 300 shown in the above-mentioned FIG. 5A. For the related description, please refer to the content above, which is not repeated herein. A solder resist layer 320 is formed on the surfaces of the insulating layers 302 and 303 to cover the first antenna layer 312 and the second antenna layer 314. The solder resist layer 320 has multiple vias V2 to expose a portion of the pad 316. The material of the solder resist layer 320 may be a solder resist material (e.g., green paint), a photosensitive dielectric material, or other suitable materials.

Then, the pads 316 of the circuit structure 300 are correspondingly connected to the first conductive connection material 240' of the interposer 200. The interposer 200 is, for example, the interposer 200 shown in the above-mentioned FIG. 3C. For the related description, please refer to the content above, which is not repeated herein. For example, the first conductive connection material 240' disposed on the first pad portion 214a of the coaxial conductive element 210 corresponds to the pad 316a of the connection circuit structure 300, and the first conductive connection material 240' disposed on the second pad portion 216a of the coaxial conductive element 210 corresponds to the pad 316b of the connection circuit structure 300.

Figure 6B:
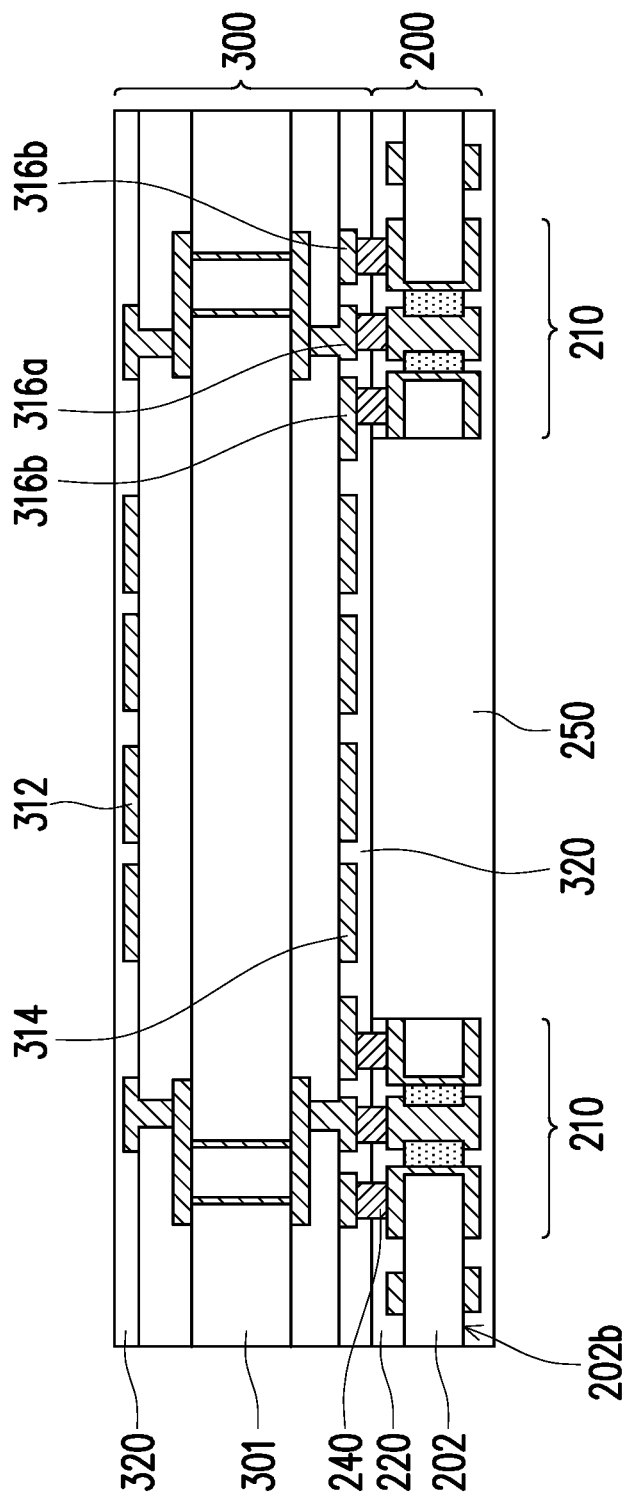

Referring to FIG. 6B, the side of the interposer 200 opposite to the first conductive connection material 240' (marked in FIG. 6A) is covered by the release layer 250, so that the through groove 230 is filled by the release layer 250 to prevent the uncured first adhesive material layer 220' (marked in FIG. 6A) from flowing out of the through groove 230. For example, the release layer 250 may be disposed on the lower surface 202b of the first insulating layer 202 to cover the first pad portion 214a and the second pad portion 216a located on the lower surface 202b of the first insulating layer 202, the sidewall of the through groove (i.e., the sidewalls of first insulating layer 202, the first conductive layer 205, and the first adhesive material layer 220') and the solder resist layer 320.

Continue to refer to FIG. 6B, at the first temperature, the circuit structure 300 and the interposer 200 are pressed together to cure the first adhesive material layer 220' to a c-stage to form the first adhesive layer 220. The first temperature is for example between 180° C. to 220° C.

In some embodiments, the first conductive connection material 240' may be heated and melted at the first temperature, and then cured to form the first conductive connection element 240, so that the pads 316 of the circuit structure 300 and the corresponding coaxial conductive elements 210 may be bonded and electrically connected in good condition. In some embodiments, if the first conductive connection material 240' is a transient liquid phase sintering conductive glue, since it includes metal solder particles (such as copper, tin-bismuth alloy, etc.), a combination of metal particles in the liquid phase may be generated at the interface through heating, which is further cured to form an intermetallic compound (IMC), so as to improve the bonding force of the interface and to have good electrical conductivity.

Figure 6C:
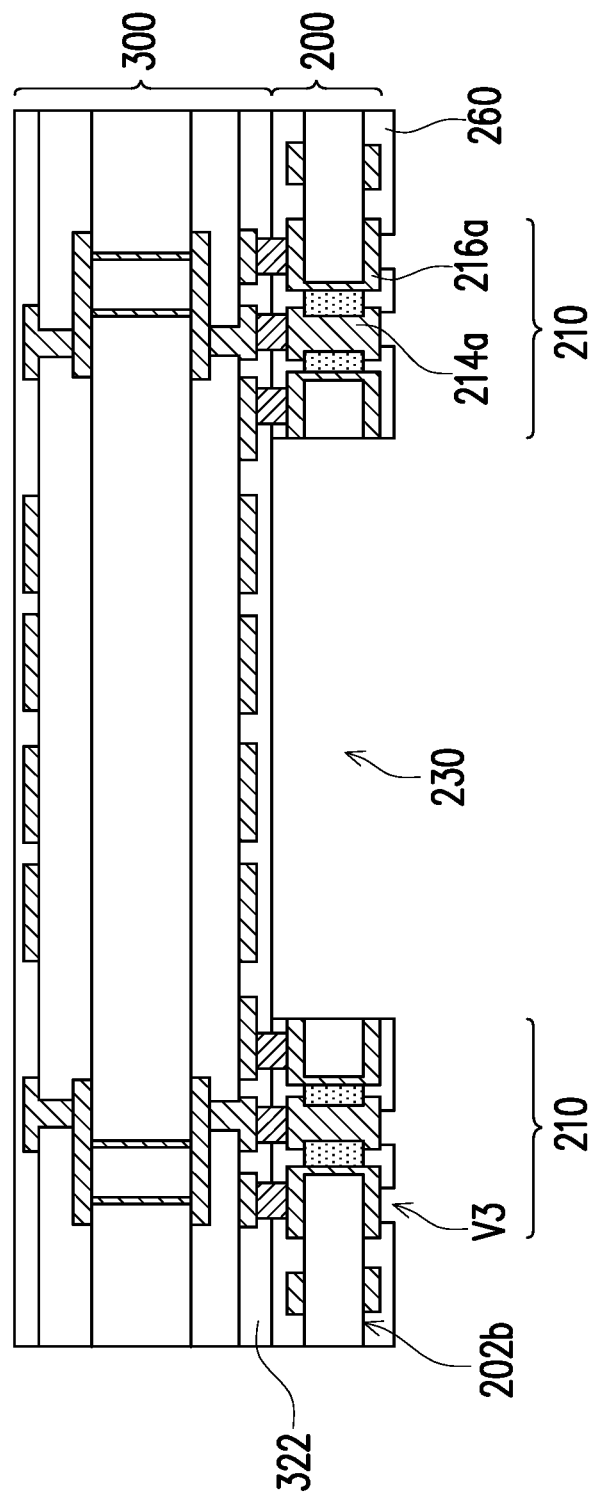

Referring to FIG. 6C, the release layer 250 is removed, and a solder resist layer 260 is formed on the lower surface 202b of the first insulating layer 202. The solder resist layer 260 includes multiple vias V3 to expose a portion of the first pad portion 214a and a portion of the second pad portion 216a of the coaxial conductive element 210 located on the lower surface 202b. The material of the solder resist layer 260 may be a solder resist material (e.g., green paint), a photosensitive dielectric material, or other suitable materials.

Figure 6D:
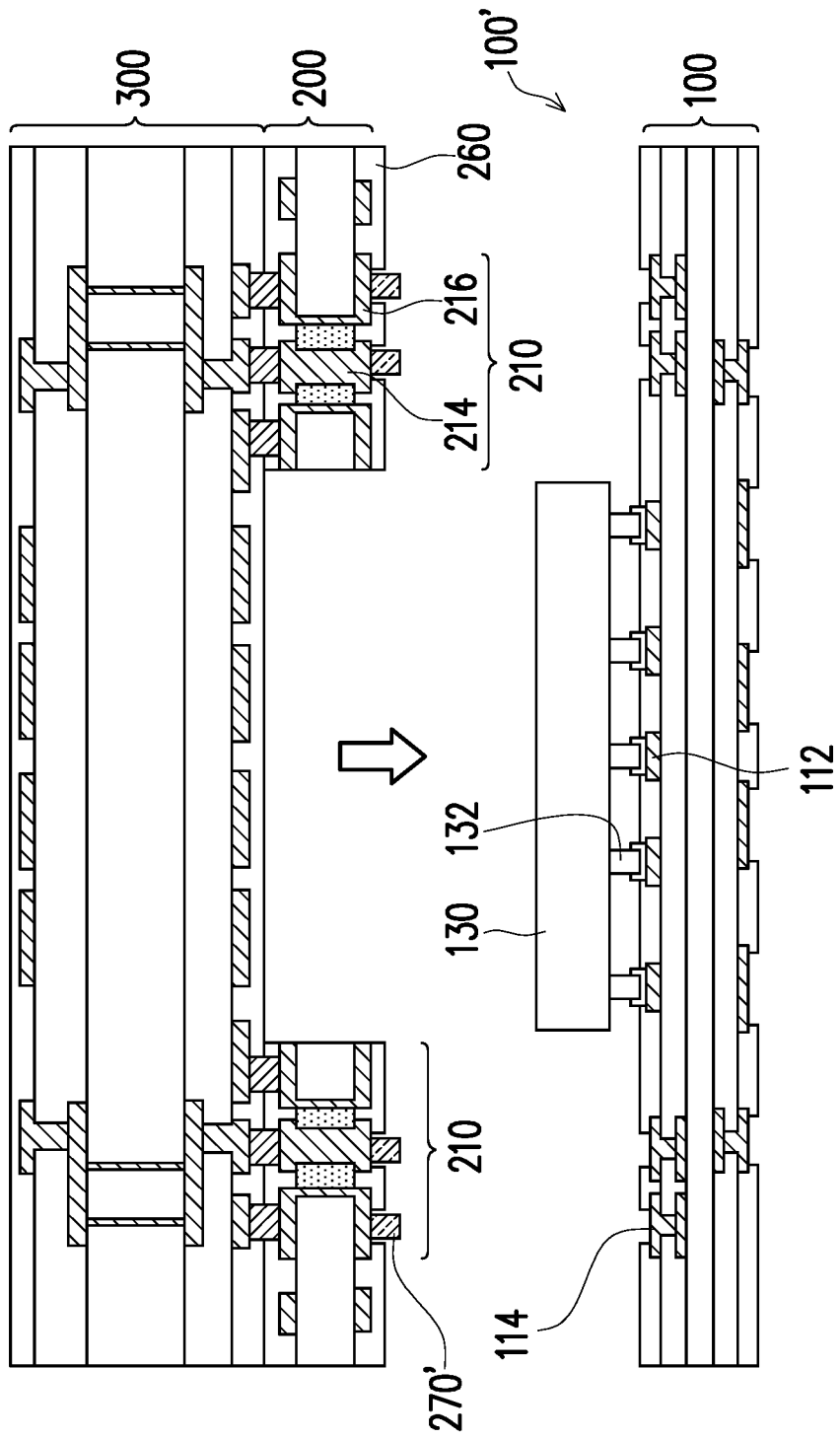

Referring to FIG. 6D, a second conductive connection material 270' is formed in the vias V3 (marked in FIG. 6C). The second conductive connection material 270' may be, for example, a solder paste, a solder ball, or other suitable materials.

Figure 6E:
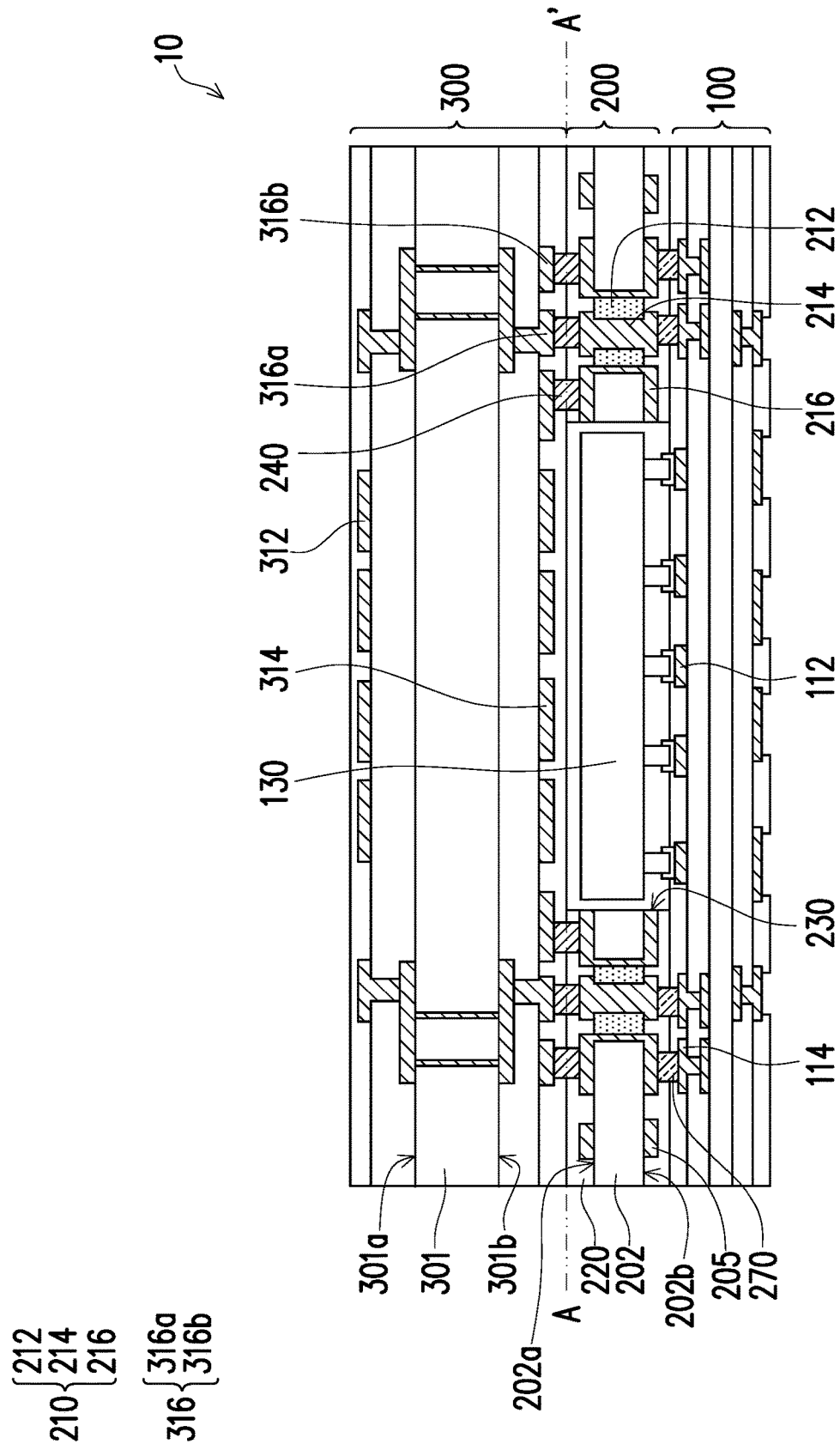

Referring to FIG. 6D and FIG. 6E, the interposer 200 and the circuit board 100 are bonded through the second conductive connection material 270'. For example, the chip 130 may be disposed on the circuit board 100 first, such as the circuit board structure 100' shown in FIG. 1C. For the related description, please refer to the content above, which is not repeated herein. Then, the second conductive connection material 270' may be connected to the pads 114 of the circuit board 100 correspondingly. In some embodiments, the second conductive connection material 270' may be subjected to a reflow process at a second temperature to form a second conductive connection element 270 to improve the bonding strength of the interposer 200 and the circuit board 100.

A After the above process, the fabrication of an electronic package structure 10 may be substantially completed.

Figure 7:
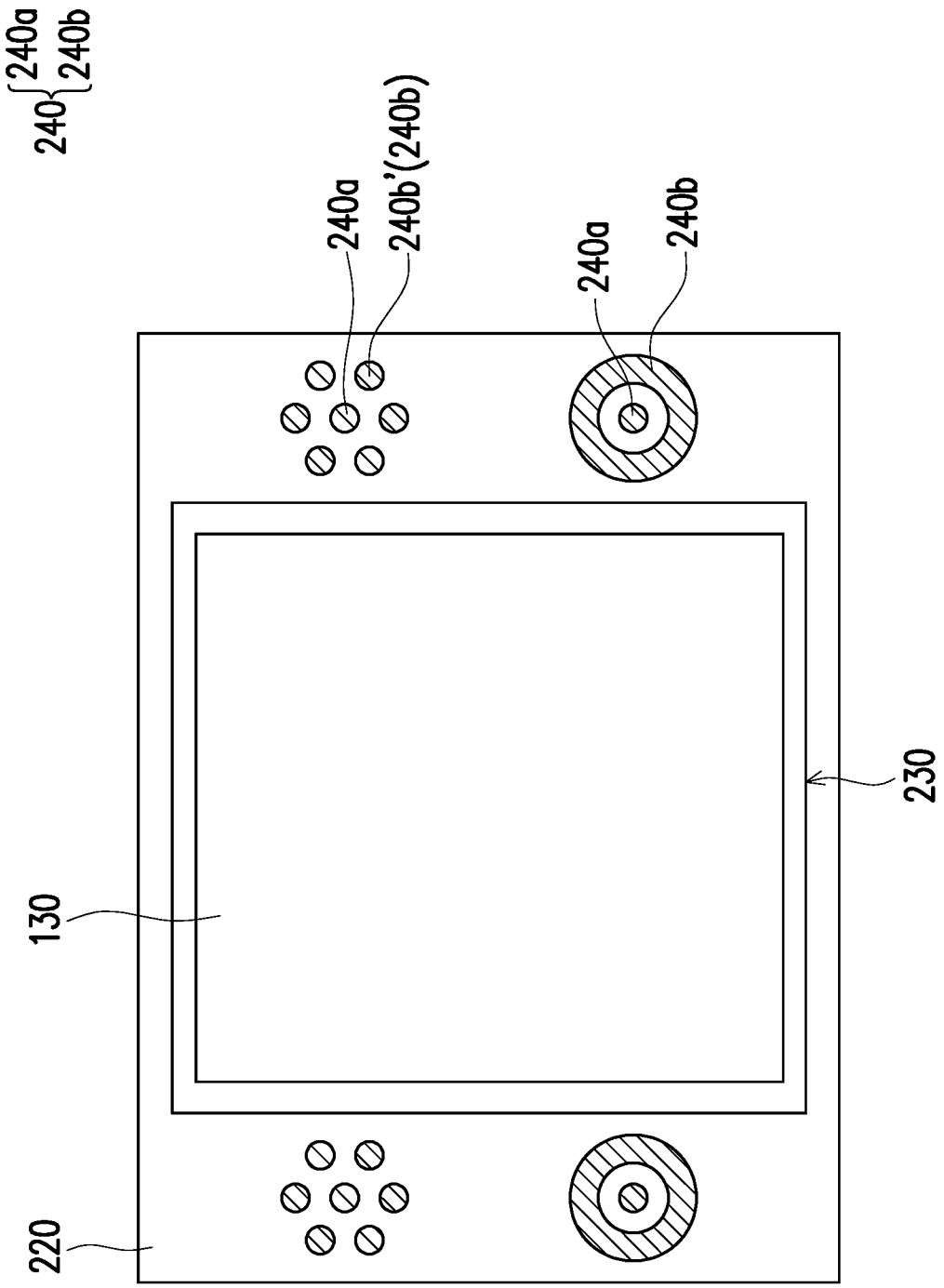
FIG. 7 is a partial top schematic view of the electronic package structure of FIG. 6E along a section line A-A'.

FIG. 7 is a partial top schematic view of the electronic package structure of FIG. 6E along a section line A-A'.

Referring to FIG. 6E and FIG. 7, the electronic package structure 10 includes a circuit board 100, an interposer 200, a chip 130, a circuit structure 300, and a coaxial conductive element 210. The interposer 200 is disposed on the circuit board 100, in which the interposer 200 has a through groove 230. The chip 130 is disposed in the through groove 230 and is located on the circuit board 100 to electrically connect with the circuit board 100. The circuit structure 300 is disposed on the interposer 200. The coaxial conductive element 210 penetrates the interposer 200 to electrically connect the circuit structure 300 and the circuit board 100. The coaxial conductive element 210 includes a first conductive structure 214, a second conductive structure 216, and a first insulating structure 212. The second conductive structure 216 surrounds the first conductive structure 214. The first insulating structure 212 is disposed between the first conductive structure 214 and the second conductive structure 216.

Since the chip 130 may be disposed in the through groove 230 of the interposer 200, the space may be effectively utilized, which reduces the volume of the electronic package structure 10. Since the electronic package structure 10 includes the coaxial conductive element 210 disposed in the interposer, the signal loss during the transmission process of the radio frequency signal received or sent by the circuit structure 300 may be reduced, and the electromagnetic interference signal may be shielded to improve the integrity of the signal.

In some embodiments, the circuit structure 300 includes a first core layer 301, a first antenna layer 312, a second antenna layer 314, and multiple pads 316. The first core layer 301 has a first surface 301a and a second surface 301b opposite to the first surface 301a, in which the second surface 301b faces the interposer 200. The first antenna layer 312 is disposed on the first surface 301a. The second antenna layer 314 and the pads 316 are disposed on the second surface 301b. The pads 316 may include a first pad 316a and a second pad 316b. The first pad 316a corresponds to the first conductive structures 214 of the coaxial conductive element 210, and multiple second pads 316b correspond to the second conductive structures 216 of the coaxial conductive element 210.

In some embodiments, the electronic package structure 10 further includes a first conductive connection element 240. The first conductive connection element 240 may be disposed between the pads 316 of the circuit structure 300 and the coaxial conductive element 210, so that the pads 316 and the coaxial conductive element 210 are electrically connected. In some embodiments, the material of the first conductive connection element 240 may include copper, silver, copper alloy, copper-tin alloy, tin-bismuth alloy, or other suitable materials, but the disclosure is not limited thereto.

In some embodiments, from a top view, as shown in FIG. 7, the arrangement pattern of the first conductive connection element 240 corresponding to the coaxial conductive element 210 may correspond to the arrangement of the pads 316 of the circuit structure 300 as shown in FIG. 5B. That is to say, the first conductive connection element 240 may include a middle conductive connection element 240a corresponding to the pad 316a, and multiple peripheral conductive connection elements 240b' corresponding to the pads 316b'. The peripheral conductive connection elements 240b' surround the middle conductive connection element 240a. In other embodiments, from a top view, as shown in FIG. 7, the arrangement pattern of the first conductive connection element 240 corresponding to the coaxial conductive element 210 may correspond to the arrangement of the pads 316 of the circuit structure 300 as shown in FIG. 5C. That is to say, the first conductive connection element 240 may include a middle conductive connection element 240a corresponding to the pad 316a, and a peripheral conductive connector 240b corresponding to a single pad 316b. The peripheral conductive connection element 240b is annular and surrounds the middle conductive connection element 240a.

Although FIG. 7 shows that the electronic package structure 10 includes two arrangement patterns of the first conductive connection element 240 corresponding to the coaxial conductive elements 210, it is not intended to limit the disclosure. The first conductive connection element 240 of the electronic package structure 10 may only include one arrangement pattern corresponding to the coaxial conductive element 210.

In some embodiments, the coaxial conductive element 210 may be disposed around the through groove 230, for example, on both sides of the through groove 230, but the disclosure is not limited thereto. Although FIG. 6E and FIG. 7 show that the coaxial conductive elements 210 are symmetrically disposed on both sides of the chip 130, they are not intended to limit the disclosure. The position and number of the coaxial conductive elements 210 may be adjusted according to actual needs.

In some embodiments, the interposer 200 may include a first insulating layer 202 and a first conductive layer 205. The first conductive layer 205 is disposed on the upper surface 202a and the lower surface 202b of the first insulating layer 202. The through groove 230 may penetrate the first insulating layer 202 and the first conductive layer 205. In some embodiments, the first insulating layer 202 and the first conductive layer 205 are substantially flush with the sidewall of the through groove 230.

In some embodiments, the dimensions (e.g., length, width, height) of the through groove 230 are at least larger than the dimensions of the chip 130, so that the chip 130 may be accommodated in the through groove 230.

In some embodiments, the electronic package structure 10 further includes a first adhesive layer 220. The first adhesive layer 220 may be disposed between the interposer 200 and the circuit structure 300 to facilitate bonding of the interposer 200 and the circuit structure 300.

In some embodiments, the circuit board 100 may include multiple pads 114 corresponding to the coaxial conductive element 210. The electronic package structure 10 further includes a second conductive connection element 270, which may be disposed between the circuit board 100 and the coaxial conductive element 210. For example, the second conductive connection element 270 may be disposed between the pad 114 of the circuit board 100 and the coaxial conductive element 210, so that the pad 114 and the coaxial conductive element 210 are electrically connected. In some embodiments, the material of the second conductive connection element 270 may include tin, copper-tin alloy, lead-free alloy or other suitable materials, but the disclosure is not limited thereto.

In some embodiments, the first conductive structure 214 of the coaxial conductive element 210 is suitable for transmitting a signal, and the second conductive structure 216 is suitable for grounding or connecting to a power source. That is to say, the pad 114 of the circuit board 100 corresponding to the first conductive structure 214 may be a signal pad, and the pad 114 of the circuit board 100 corresponding to the second conductive structure 216 may be a ground pad or a power source pad.

To sum up, the electronic package structure 10 of the disclosure may integrate the circuit board 100, the interposer 200, and the circuit structure 300 into a package structure, and the chip 130 is disposed in the through groove 230 of the interposer 200, so that the space may be effectively utilized, which is beneficial to the miniaturization of the electronic package structure 10. In addition, the electronic package structure 10 also includes a coaxial conductive element 210 disposed in the interposer, which may effectively prevent the signal loss caused by the spread of the radio frequency signal during the transmission process, and may shield the electromagnetic interference signal to improve the integrity of the signal.

Although the disclosure has been described in detail with reference to the above embodiments, they are not intended to limit the disclosure. Those skilled in the art should understand that it is possible to make changes and modifications without departing from the spirit and scope of the disclosure. Therefore, the protection scope of the disclosure shall be defined by the following claims.

What is claimed is:
1. An electronic package structure, comprising:
   a circuit board;
   an interposer, disposed on the circuit board, wherein the interposer has a through groove;
   a chip, disposed in the through groove and located on the circuit board to electrically connect with the circuit board;
   a circuit structure, disposed on the interposer; and
   a coaxial conductive element, penetrating the interposer to electrically connect the circuit structure and the circuit board, wherein the coaxial conductive element comprises:
      a first conductive structure;
      a second conductive structure, surrounding the first conductive structure, wherein the first conductive structure and the second conductive structure have a same axis; and
      a first insulating structure, disposed between the first conductive structure and the second conductive structure,
   wherein the interposer comprises:
      a first insulating layer, having an upper surface and a lower surface opposite to the upper surface; and
      a first conductive layer, disposed on the upper surface and the lower surface, wherein the through groove penetrates the first insulating layer and the first conductive layer.
2. The electronic package structure according to claim 1, wherein the coaxial conductive element is disposed around the through groove.
3. The electronic package structure according to claim 1, wherein the circuit structure comprises:
   a first core layer, having a first surface and a second surface opposite to the first surface, wherein the second surface faces the interposer;
   a first antenna layer, disposed on the first surface;
   a second antenna layer, disposed on the second surface; and
   a plurality of pads, disposed on the second surface and corresponding to the coaxial conductive element.
4. The electronic package structure according to claim 3, wherein the pads comprises:
   a first pad, corresponding to the first conductive structure of the coaxial conductive element; and
   a second pad, corresponding to the second conductive structure of the coaxial conductive element, wherein the second pad is annular.
5. The electronic package structure according to claim 3, wherein the pads comprises:
   a first pad, corresponding to the first conductive structure of the coaxial conductive element; and
   a plurality of second pads, corresponding to the second conductive structure of the coaxial conductive element, wherein the second pads surround the first pad.
6. The electronic package structure according to claim 3, further comprising:
   a first conductive connection element, disposed between the pads of the circuit structure and the coaxial conductive element.
7. The electronic package structure according to claim 1, further comprising:
   a first adhesive layer, disposed between the interposer and the circuit structure.
8. The electronic package structure according to claim 1, wherein the circuit board comprises a plurality of pads corresponding to the coaxial conductive element, and the electronic package structure further comprises:
   a second conductive connection element, disposed between the pads of the circuit board and the coaxial conductive element.
9. The electronic package structure according to claim 1, wherein the first conductive structure of the coaxial conductive element is suitable for transmitting a signal, and the second conductive structure is suitable for grounding or connecting to a power source.
10. A manufacturing method of an electronic package structure, comprising:
    providing a circuit board;
    disposing a chip on the circuit board;
    providing an interposer substrate, wherein the interposer substrate comprises a first insulating layer and a first conductive material layer covering an upper surface and a lower surface of the first insulating layer, the upper surface and the lower surface are opposite to each other;
    forming a coaxial conductive element in the interposer substrate, wherein the coaxial conductive element comprises:
       a first conductive structure;
       a second conductive structure, surrounding the first conductive structure, wherein the first conductive structure and the second conductive structure have a same axis; and
       a first insulating structure, disposed between the first conductive structure and the second conductive structure;
    forming a through groove penetrating the first insulating layer and the first conductive layer of the interposer substrate to form an interposer;
    providing a circuit structure, pressing the circuit structure on the interposer at a first temperature; and
    after pressing the circuit structure on the interposer, bonding the interposer to the circuit board at a second temperature, and disposing the chip in the through groove of the interposer.
11. The manufacturing method according to claim 10, wherein forming the coaxial conductive element in the interposer substrate comprises:
    forming a first through hole in the interposer substrate;

forming a second conductive material layer on the interposer substrate and a sidewall of the first through hole;
filling the first through hole with an insulating material;
forming a second through hole in the insulating material;
forming a third conductive material layer on the interposer substrate and in the second through hole; and
patterning the third conductive material layer to form the coaxial conductive element.

12. The manufacturing method according to claim 11, wherein a hole diameter of the first through hole is between 250 μm to 450 μm, and a hole diameter of the second through hole is between 50 μm to 100 μm.

13. The manufacturing method according to claim 11, further comprising:
    forming a first adhesive material layer on the upper surface of the first insulating layer, wherein the first adhesive material layer is in a semi-cured state;
    after forming the first adhesive material layer on the upper surface of the first insulating layer, forming the through groove in the interposer substrate to form the interposer;
    forming a plurality of vias in the first adhesive material layer to expose a portion of the coaxial conductive element; and
    forming a first conductive connection material in the vias.

14. The manufacturing method according to claim 13, wherein the first conductive connection material comprises copper glue, silver glue, or transient liquid phase sintering glue.

15. The manufacturing method according to claim 13, wherein pressing the circuit structure on the interposer comprises:
    correspondingly connecting a plurality of pads of the circuit structure to the first conductive connection material;
    covering a side of the interposer opposite to the first conductive connection material with a release layer, so that the through groove is filled by the release layer;
    pressing the circuit structure and the interposer together to cure the first adhesive material layer at the first temperature; and
    removing the release layer.

16. The manufacturing method according to claim 11, wherein bonding the interposer to the circuit board comprises:
    forming a solder resist layer on the lower surface of the first insulating layer, wherein the solder resist layer comprises a plurality of vias to expose a portion of the coaxial conductive element;
    forming a second conductive connection material in the vias; and
    bonding the interposer and the circuit board through the second conductive connection material.

17. The manufacturing method according to claim 16, wherein the second conductive connection material comprises a solder paste or a solder ball.

18. The manufacturing method according to claim 16, wherein the second conductive connection material is subjected to a reflow process at the second temperature to form a second conductive connection element, wherein the second temperature is greater than the first temperature.

19. The manufacturing method according to claim 10, wherein the first temperature is between 180° C. to 220° C., and the second temperature is between 250° C. to 270° C.

* * * * *